United States Patent
Gopal et al.

(10) Patent No.: US 7,151,388 B2
(45) Date of Patent: Dec. 19, 2006

(54) METHOD FOR TESTING SEMICONDUCTOR DEVICES AND AN APPARATUS THEREFOR

(75) Inventors: Ballson Gopal, Chandler, AZ (US); Ching Peng Teong, Singapore (SG); Samuel Syn Soo Lim, Singapore (SG)

(73) Assignee: Kes Systems, Inc., Tempe, AZ (US)

( * ) Notice: Subject to any disclaimer, the term of this patent is extended or adjusted under 35 U.S.C. 154(b) by 0 days.

(21) Appl. No.: 10/954,920

(22) Filed: Sep. 30, 2004

(65) Prior Publication Data
US 2006/0066293 A1    Mar. 30, 2006

(51) Int. Cl.
*G01R 31/26* (2006.01)

(52) U.S. Cl. ............. 324/765; 324/760; 324/158.1; 209/573

(58) Field of Classification Search ........... 324/158.1, 324/754–762, 765; 209/573–574
See application file for complete search history.

(56) References Cited

U.S. PATENT DOCUMENTS

| | | | |
|---|---|---|---|
| 4,902,969 A | 2/1990 | Gussman | |
| 5,313,156 A * | 5/1994 | Klug et al. | 324/158.1 |
| 5,805,472 A | 9/1998 | Fukasawa | |
| 5,847,572 A * | 12/1998 | Iwasaki et al. | 324/755 |
| 5,865,319 A * | 2/1999 | Okuda et al. | 209/574 |
| 6,104,183 A * | 8/2000 | Kobayashi et al. | 324/158.1 |
| 6,140,829 A * | 10/2000 | Sharpes et al. | 324/760 |
| 6,163,145 A | 12/2000 | Yamada et al. | |
| 6,239,396 B1 * | 5/2001 | Kang | 209/573 |
| 6,313,652 B1 * | 11/2001 | Maeng | 324/760 |
| 6,314,332 B1 * | 11/2001 | Kida | 700/113 |
| 6,323,666 B1 | 11/2001 | Ohba | |
| 6,346,682 B1 | 2/2002 | Kim et al. | |
| 6,448,524 B1 | 9/2002 | McKenney et al. | |
| 6,472,893 B1 | 10/2002 | Martin | |
| 6,476,629 B1 | 11/2002 | Bjork | |
| 6,515,470 B1 | 2/2003 | Suzuki et al. | |
| 6,521,853 B1 | 2/2003 | Olson et al. | |
| 6,559,665 B1 * | 5/2003 | Barabi | 324/755 |
| 6,563,331 B1 | 5/2003 | Maeng | |
| 6,815,969 B1 * | 11/2004 | Yagi | 324/765 |
| 6,882,141 B1 * | 4/2005 | Kim | 324/158.1 |
| 2002/0149389 A1 | 10/2002 | Bjork | |

* cited by examiner

*Primary Examiner*—Jermele Hollington
*Assistant Examiner*—Arleen M. Vazquez
(74) *Attorney, Agent, or Firm*—Lerner,David,Littenberg,Krumholz & Mentlik, LLP

(57) ABSTRACT

A method for testing integrated circuit devices and loading such devices into a test board for further testing and an apparatus therefor is disclosed. The method allows for selection between two modes of operation. In a first mode, the integrated circuit devices are subjected to an electrical test before being placed into the test board for further testing. In a second mode, the integrated circuit devices are tested after being placed in the test board. The apparatus allows for the selection between the first mode and the second mode. In either mode, information about the tested devices and the sockets in the test board is used to load the test boards intelligently. Intelligent loading means that devices under test (DUTs) are not placed in bad sockets and devices that do test bad are removed from the test board, with an option of replacing the failed DUT with another DUT before subsequent environmental testing of the DUTs in the test board is carried out.

20 Claims, 7 Drawing Sheets

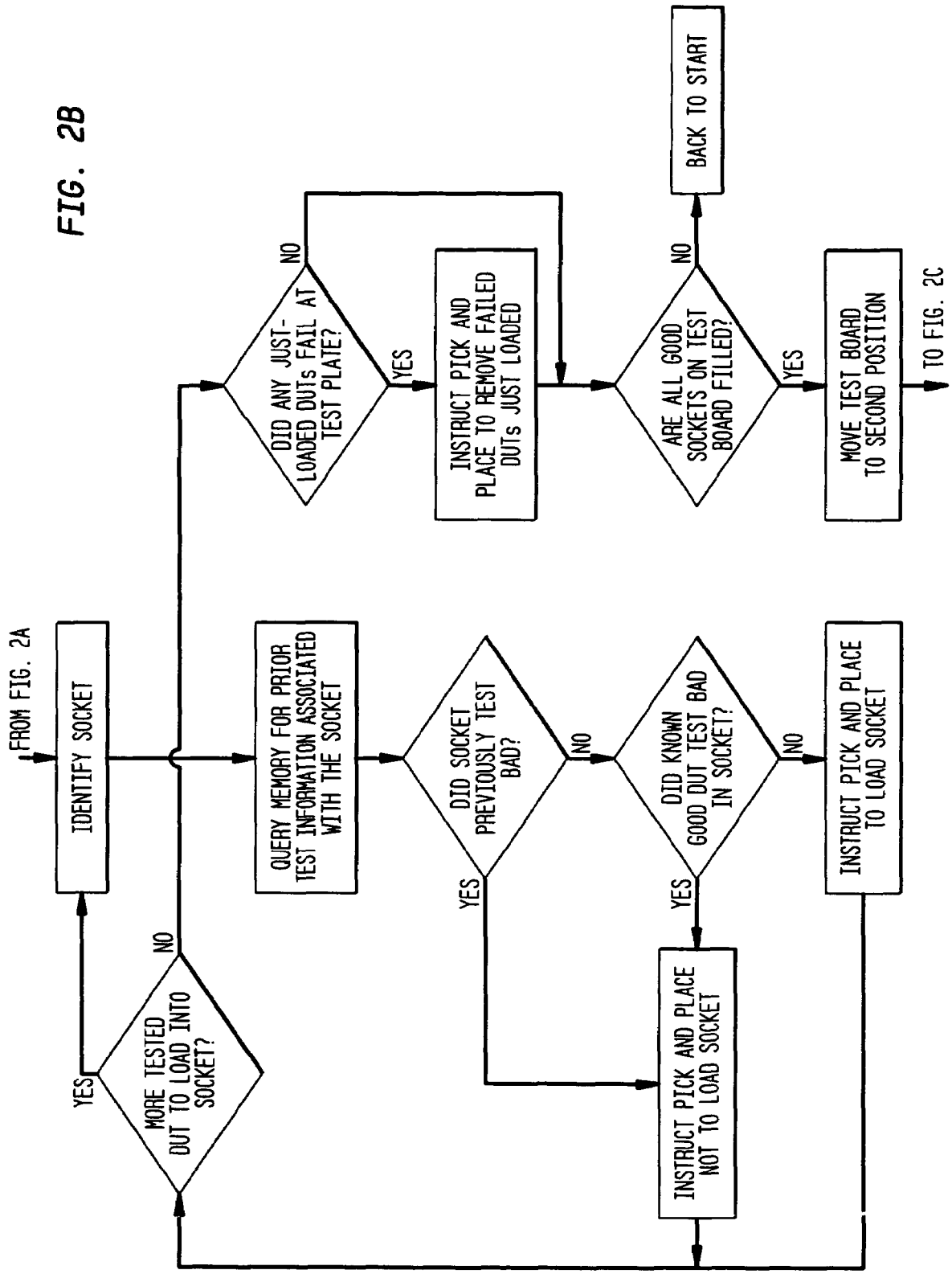

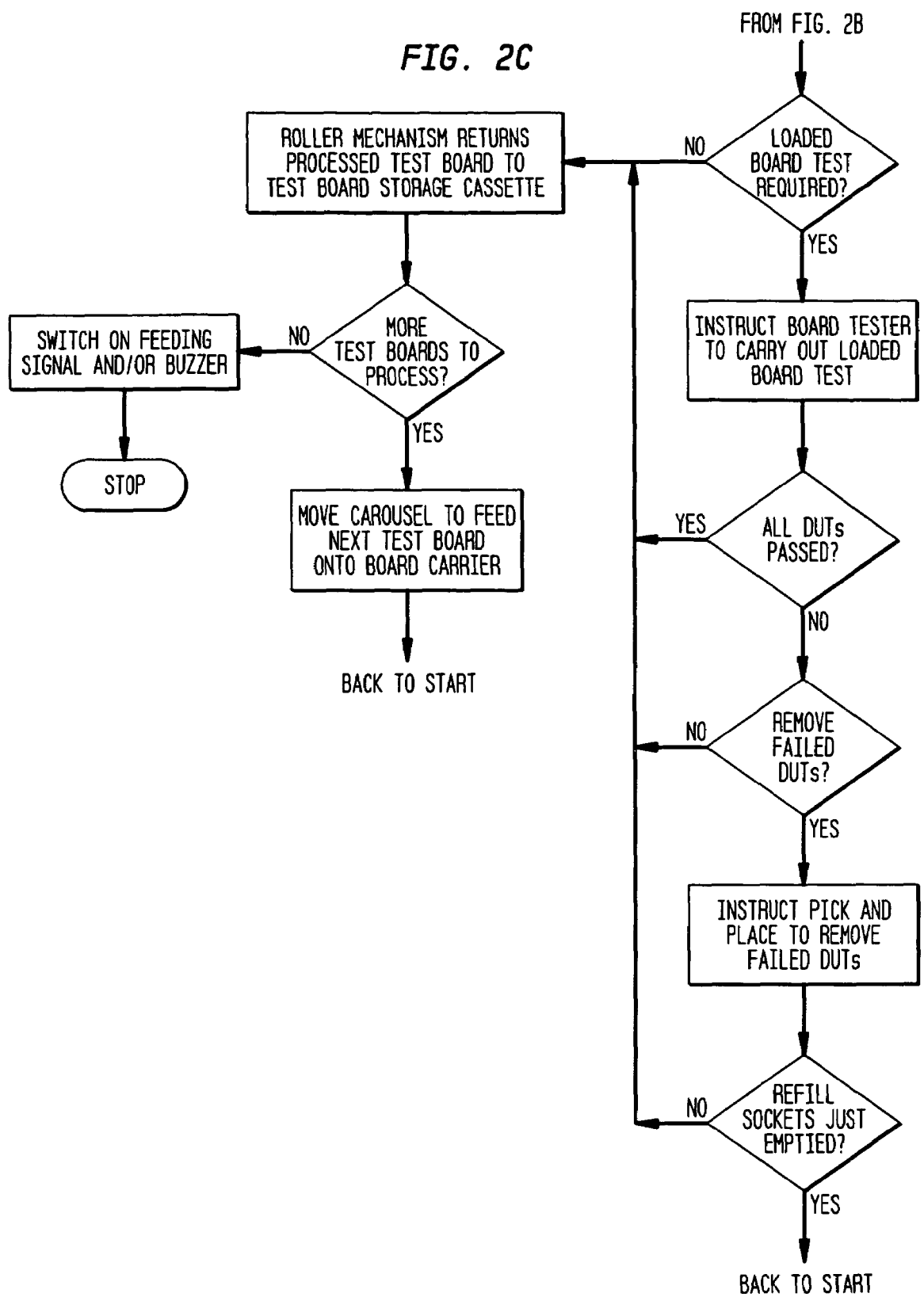

METHOD FOR TESTING SEMICONDUCTOR DEVICES AND AN APPARATUS THEREFOR

BACKGROUND OF THE INVENTION

The present invention relates generally to an apparatus and method for testing semiconductor devices. More particularly, the present invention relates to a test apparatus for packaged semiconductor devices that utilizes a pick-and-place mechanism to transfer the devices between and among various locations in the apparatus.

Integrated circuit (IC) devices are subjected to a variety of tests after fabrication. These tests occur before the IC is packaged and after the IC is packaged. The tests are designed to determine if the IC will meet performance and lifetime specifications.

Apparatus with many different configurations are used to test IC devices. In many apparatus, such as the apparatus described in U.S. Pat. No. 6,323,666 to Ohba et al., the IC's are loaded into some sort of test board for environmental testing. Typically, the apparatus performs some initial electrical tests on the IC before subjecting the device to the environmental testing. That way, the more expensive, time consuming environmental test is only performed on ICs that pass the initial test. Other apparatus that describe apparatus the perform some electrical testing of ICs prior to environmental testing are described in U.S. Pat. No. 4,902,969 to Gussman and U.S. Pat. No. 6,563,331 to Maeng.

Environmental testing is typically referred to as a burn-in test. The test is described as burn-in because it is done at an elevated temperature. Burn-in typically involves placing a large number of integrated circuit (IC) devices on printed circuit boards, referred to herein as test boards. The boards are placed in a chamber in which the environmental conditions, particularly temperature, are controlled. The IC devices are then subjected to electrical tests such as the application of DC current to forward and reverse bias the individual junctions in the IC or actively clocking the ICs to their maximum rated conditions. Running these tests at elevated temperature identifies ICs that do not perform according to their minimum specifications.

There are two major objectives associated with such testing. The first and foremost objective is to ensure that ICs that fail or are likely to fail are discovered and kept from being used (at least in the application for which they were identified as likely to fail). The failed ICs, once identified, might be recycled, repaired, retested, etc. The second equally important objective is that the good ICs are not falsely identified as bad ICs. Such misclassification has a number of downsides. First, it wastes an otherwise good IC by preventing it from being used for its intended purpose. Second, a series of false failures can give the impression of an artificially high fail rate. This could lead to an unnecessary, expensive, and time-consuming search for the source or sources of the fail rate.

Many apparatus have been proposed to more accurately identify failed ICs and to ensure that the ICs are not improperly identified as failures due to some defect or malfunction in the apparatus itself. One such approach is described in U.S. Pat. No. 6,323,666 to Ohba et al. With reference to FIG. 1, a test and burn-in system handler 10 is illustrated schematically. An electronic switch 4 is provided to switch between test signals of the IC test circuit 2 and the test signals of the burn-in board checker 3. The IC test circuit 2, the burn-in board checker 3 and the electrical switch 4 are made up as a unit.

The IC test circuit 2 is used to perform a pretest of the IC's 1A as the devices under test. The burn-in board checker 3 is for testing the burn-in board 1 to detect pattern disconnection, solder failure, short circuits or other defects. The alignment stage 6 is used to straighten the attitude of the IC's 1A.

The handler 10 is operated in the following manner. The carrier rack 8 has multiple burn-in boards 1, which, when loaded into the handler 10, do not contain IC devices. The burn-in boards 1, are inserted sequentially and each burn-in board, 1, is tested by the burn-in board checker 3 to determine if the burn-in board 1 contains any bad IC sockets. The burn-in board waits in this position to receive ICs 1A.

The ICs are transferred one at a time from the tray 5 to the alignment stage 6. After the attitudes of the ICs are straightened at the alignment stage 6, the ICs 1A are populated into the burn-in board 1. If the burn-in board has a defective socket, the loading software is instructed not to populate that socket with an IC.

After the burn-in board is loaded, the switch 4 is deployed to activate the IC test circuit 2. Simplified functional tests are performed on the ICs populating the burn-in board 1. After the electrical pretest, the ICs that are determined to be defective are removed from the burn-in board 1 while the devices that passed the pre-test remain. Once all of the normal sockets in the burn-in board 1 are loaded with ICs that were determined to be non-defective, the burn-in board is returned to the carrier rack 8. Once all of burn-in boards 1 in the carrier rack 8 are filled, the carrier rack is transferred to the burn-in apparatus.

While the apparatus described above achieves some efficiency and accuracy by testing individual sockets in burn-in boards before loading ICs therein, greater efficiency and flexibility for such test apparatus are sought while still ensuring the IC failures are properly attributed to the IC device, and not actually the result of a bad burn-in board socket or other extraneous reason.

SUMMARY OF THE INVENTION

One aspect of the present invention provides an automated test handler system for testing integrated circuit devices prior to subjecting those devices to an environmental test. The test handler offers at least two modes of operation. In a first mode, individual integrated circuit (IC) devices under test (DUTs hereinafter) are electrically tested before they are placed in a test board. In a second mode, DUTs are electrically tested while in the test board. A test of DUTs when they are in the test board is referred to as a parallel test hereinafter. In yet a third mode, the DUTs are individually tested prior to being placed in the test board and are also subjected to a parallel test.

The at least two modes of operation provide certain advantages over prior art methods and apparatus. In operation of the test handler system, according to this aspect of the present invention, the user can select between a mode where a high failure rate is expected (e.g. when new or prototype devices are being tested, the number of hard-failure devices is likely to be higher) and a mode where a lower failure rate is expected (e.g. devices that have been manufactured for some time). In the first mode, an individual electrical test is performed on DUTs before they are placed in the test board. This ensures that, if the DUTs do experience a hard-failure, the test of other DUTs will not be otherwise adversely affected (hard failure can pull down signal lines and stop test execution). Also, the individual electrical test can be performed if the test parameters require very tight tolerances or exacting test standards. As previously noted, in certain embodiments, the DUT will be subjected to both an individual electrical test and a parallel test.

The test handler system of the present invention provides an advantageous flexibility in the testing of ICs. By providing two test stations, a parallel test station and an individual test station, the system is able to perform both sophisticated and exacting electrical tests on individual DUTs when required, yet can perform basic electrical tests on multiple DUTs simultaneously. By tracking the response of sockets to electrical tests (sockets can either be tested when empty using a probe-type device or when populated with a DUT as described in detail below) and linking the results of device tests to the sockets in which they were performed, the apparatus according to this aspect of the present invention can intelligently and more effectively manage the loading and unloading of test boards, and the testing of ICs, both individually and when populating sockets in test boards.

The test handler system includes a handling apparatus that may consist of a unitary apparatus or as a set of apparatus that are operated in a coordinated fashion. The handling apparatus is used to manage the test and placement of DUTs. The test and handling apparatus typically has a single housing that ensures that the DUTs therein are kept in a sufficiently clean environment. Although the DUTs will be packaged, it is still desirable for the DUTs to be protected, as particles and moisture found in ambient conditions can adversely affect the DUTs.

The handling apparatus desirably has a pick-and-place mechanism. The pick-and-place mechanism transports the DUTs from one location to another within the system. Pick-and-place mechanisms are robotic mechanisms that are well-known in the art, and will not be described in detail herein. Pick-and-place mechanisms are also known as suitable for transporting integrated circuit (IC) devices packaged using surface mount technologies (SMT) such as ball grid arrays (BGA) or chip scale package (CSP). While referred to as pick-and-place apparatus herein, the term is intended to encompass all mechanical methods for moving individual integrated circuit devices from one location to another. Also, while the term pick-and-place apparatus is used in the singular form, it is intended to include multiple apparatus that are operated in cooperation with each other. For example, one pick-and-place apparatus can be used to load a test board and a second apparatus can be used to unload the test board. However, because they are working in cooperation with each other to accomplish loading and unloading of test boards, they are referred to as a single apparatus.

The handling apparatus also typically has a loader for loading test boards into the automated test handler system. In a preferred embodiment, the loader has a mechanism for storing a plurality of test boards in a storage cassette configuration. Such a configuration enables a plurality of empty test boards to be sequentially introduced into the apparatus. Once the test boards are populated with devices by the apparatus and those devices have been tested, the test board is returned to the storage cassette and another empty cassette is introduced into the system. This process is repeated until all devices have been tested or all cassettes are filled with completely populated test boards.

The test boards have a plurality of sockets therein. The sockets are adapted to receive the DUTs. The test boards are configured to electrically interconnect the DUTs to test circuitry of the parallel tester. The test circuitry of the parallel tester is used to evaluate the performance of the DUTs under conditions designed to determine if the DUT is performing/will perform as desired. A number of such tests can be performed and the present invention is not limited to a particular electrical test.

In addition to the parallel test described above, the test handler system is advantageously configured so that a DUT can be subjected to other, more rigorous electrical tests depending upon the needs of the manufacturer. These more rigorous electrical tests are referred to as individual device tests herein, because such tests, e.g. DC and/or parametric tests, require fully isolated test circuitry and therefore cannot be performed when the DUT is populated in a test board with other devices. Performing tests that require fully isolated test circuitry on devices populating sockets in a test board is tedious, as the devices need to be removed, tested and replaced one by one. Thus, subjecting DUTs to DC/Parametric tests when the DUTs are populating a test board would cause a significant delay in the testing process.

The test system may be configured to conduct individual device tests concurrently with the in-board tests. That is, while one board is being tested (either loaded or empty) the individual device tests are being conducted on DUTs as they are placed into a second board. An individual DUT can be sequentially subjected to both the individual test (on its way from the input tray to the test board) and the parallel test (after being populated into a test board and the board is placed in the parallel tester). This is particularly advantageous if only some of the DUTs being tested require an individual test. In such a situation, the individual test can be conducted as part of the board loading process while another test board (populated with DUTs) is being tested in the parallel tester.

The handling apparatus of the test handler system also desirably has a DUT input mechanism adapted to receive DUTs. Typically, DUTs are introduced into a test apparatus in a DUT carrier (e.g. a JEDEC tray). The handling apparatus is configured to receive such DUT carriers and convey the DUT carrier to a location in the apparatus where the DUTs can be removed from the DUT carrier by the carrier heads on a robotic pick-and-place mechanism. For example, multiple DUT carriers can be indexed and fed sequentially into the apparatus. The carrier heads are typically vacuum heads that draw the DUTs from the carrier. The pitch of the carrier heads is such that it corresponds to the pitch of the DUT carrier. This ensures that each head of the robotic pick-and-place mechanism can extract a DUT from the DUT carrier.

When the DUT is removed from the DUT carrier, it is subjected to an alignment step where the contacts of the DUT are positioned so that the DUT makes proper electrical contact for the tests performed by the apparatus. Every DUT is subjected to such an alignment step. In one embodiment, the test system is equipped with a precisor station in which the DUTs are placed for alignment. The alignment is performed before the DUT is placed in the parallel test board (or before the individual device test, if performed).

The test handler system typically is equipped with an IC test plate for performing the individual device test. The IC test plate desirably is proximate to said input tray/precisor station. The IC test plate is in electrical communication with test electronics for performing the individual device test. The test plate is configured with test sockets adapted to receive DUTs. In a preferred embodiment the IC test plate has a top alignment plate and a test-pin matrix box. The top alignment plate has a plurality of cavities, each cavity adapted to receive an individual DUT. The number of cavities and their pitch are selected to conform to the number of carrier heads and the pitch thereof of the pick-and-place mechanism. The test-pin matrix block is configured to provide electrical interconnection between a DUT and the test circuitry. The test-pin matrix block has a matrix of spring-loaded pins. The matrix is configured to correspond to the pitch (i.e. spacing) of the DUT contacts. For example if the DUT is a BGA, the matrix is configured to correspond to the ball pitch of the BGA.

The aforesaid test board carrier is placed proximate to the IC test plate. The carrier is configured to communicate with the loader to receive test boards from the loader. The test board carrier is configured to place the test boards in at least two positions within the housing. The first position is the test board load position. In this position, the pick-and-place mechanism populates DUTs into the test boards. The second position is a parallel test position where either the DUTs, the test board sockets or both the sockets and the DUTs are electrically tested at ambient temperature.

The pick-and-place apparatus is configured to transfer the DUTs between and among the input tray, the IC test plate and the test board when the test board is positioned on the test board carrier in the first position. One skilled in the art can configure a pick-and-place apparatus with the requisite range for this purpose. In one embodiment, the pick-and-place apparatus has a rail mounted above the input tray, DUT test plate and test board carrier. The rail allows for the lateral adjustment of the robotic arms' position on the rail. It is advantageous if there are a plurality of robotic arms, so that the various functions performed by these arms (e.g. unloading DUTs from carriers in the input tray, loading the test boards with DUTs, etc.) can be done simultaneously.

The parallel test feature of the test system provides electrical communication between the test boards and test circuitry. As such, the parallel tester is capable of testing one of the sockets (using probes), the DUTs in said sockets or both the DUTs and the sockets when said test board is in said second position. The electrical tests to which the DUTs and the sockets are subjected are largely a matter of design choice. Typical tests include functional tests such as clocking or pattern tests.

The test handler system desirably includes the aforementioned precisor plate. A precisor plate, as used herein, is a device that performs an alignment function. Preferably, the precisor is adapted to perform alignment for DUTs packaged using surface mount technologies (i.e. packages without a lead frame). When testing such devices, they must be oriented in a particular way when placed in the socket on the test board. Proper positional alignment is critical for surface mount devices. If a DUT is not placed in the test board socket in the proper orientation, the DUT will not test properly. This could lead to the DUT failing a test, because the connection, and not the DUT itself, is faulty. In such circumstances an otherwise good DUT would be discarded, which is an obviously undesirable result.

In another embodiment of the present invention, the results of the parallel test, or the results of testing the sockets in an empty test board (i.e. a test board not populated with devices) is used when the pick-and-place mechanism is populating the test boards with DUTs. The test system is equipped with a test board population controller for this purpose. The controller receives test information from the parallel test station. The test information received is test information associated with the sockets in the test board. The test result (i.e. whether the socket tested good or bad, or is otherwise likely to be good or bad) is stored in memory and is associated with that particular socket. Thereafter, when the board that contains that socket is again in place for loading, the controller queries the memory for information about the sockets in that test board. If there are one or more bad sockets in the test board, the controller conveys instructions to the pick-and-place apparatus not to populate those sockets with DUTs.

In a preferred embodiment, the test handler system is equipped with a mode controller. The mode controller allows a switch in operation mode of the apparatus from a first mode to a second mode. In the first mode, at least some of the DUTs are subjected to an individual device test before they are populated into a test board. In this mode, DUTs that fail the individual test are still populated into the board in the first place. However, the fact of this failed DUT, and its location in the test board, is stored into memory. The portion of the pick-and-place mechanism that is used to unload/remove IC devices from the test board is instructed to remove the failed DUTs and place them in a carrier on an output tray. The test board is in the first position when the DUTs are tested in the test plate. After known good sockets are populated with known good devices, the test board is moved to the second position for an in-board test, if required. Otherwise, the loaded test board is returned to the carrier.

In the second mode, DUTs are not individually tested in the test plate. Rather the test board is populated with DUTs that are transferred from the input carrier tray to the precisor and then to the test board by the pick-and-place mechanism. Once the test board has been populated with DUTs by the pick-and-place mechanism, the test board is moved to the second position where all of the DUTs in the board are subjected to an electrical test simultaneously. In this mode, since bad DUTs are not removed when the test board is in the first position, the output tray used for discarding devices when the apparatus is operated in the first mode can be used as an input tray to accelerate the population of DUTs into the test board.

As previously noted, the population controller loads the test board intelligently using the test information obtained about the DUTs and the test information obtained about the sockets that are to be populated with the DUTs. This includes the information from the individual electrical tests on DUTs. Specifically, the results of the individual electrical tests done before the DUTs are loaded into the test board are saved and associated with the socket into which the DUT is placed after it passes such test (DUTs that fail are ultimately separated from the known good devices). When the test board having one or more DUTs that were subjected to an individual electrical test is then moved to the second position and tested again, the results of the individual test are accessed from memory. The results of the individual test are then compared with the results of the board test. If the IC that passed the individual test failed the board test, this indicates that the socket, not the DUT, is bad. This information is stored into memory and the population controller, when executing a query whether or not to load a DUT into this socket during a subsequent load of the test board, will instruct the pick-and-place mechanism not to populate this socket.

Bad sockets are also detected by testing a loaded test board and comparing it with a prior electrical test of that same loaded test board. The results of the prior electrical tests are stored in memory and that information is accessed during subsequent electrical test of that same test board. If a given socket is associated with multiple previous tests that DUTs failed, that association indicates that the socket is bad.

In yet another embodiment, if a DUT fails the electrical tests performed in the parallel tester, the test board can be moved back to the first position where the failed DUT can be removed and the vacated socket refilled with another device. The test board is then moved back to the second position, where the DUTs are again subjected to an electrical test. This cycle can be repeated until all available sockets are filled with DUTs that pass the electrical tests in the parallel test station. This ensures that all devices sent on for environmental testing at least passed the initial, less rigorous tests at ambient temperature.

In yet another embodiment, the test handler system has a sorter mode in which populated boards, returned from environmental testing, are unloaded. The DUTs that failed the environmental are sorted from those that passed the environmental test.

BRIEF DESCRIPTION OF THE DRAWINGS

FIG. 2(a)–2(c) is a flow chart for the IC test process according to one embodiment of the present invention;

DETAILED DESCRIPTION

Figure 1:
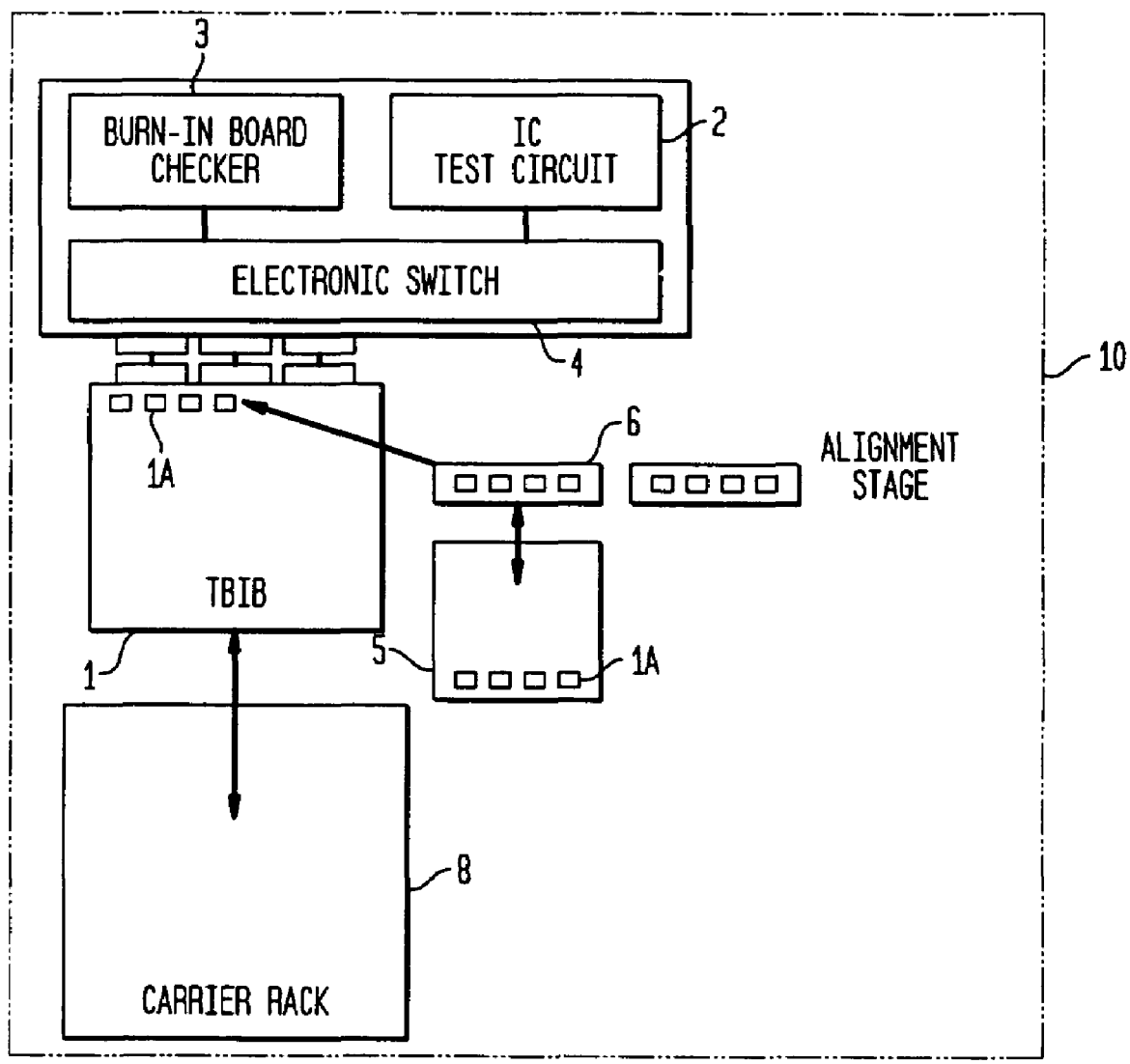
FIG. 1 is a schematic illustration of a test handler apparatus for environmental testing of the prior art.
Figure 2A:
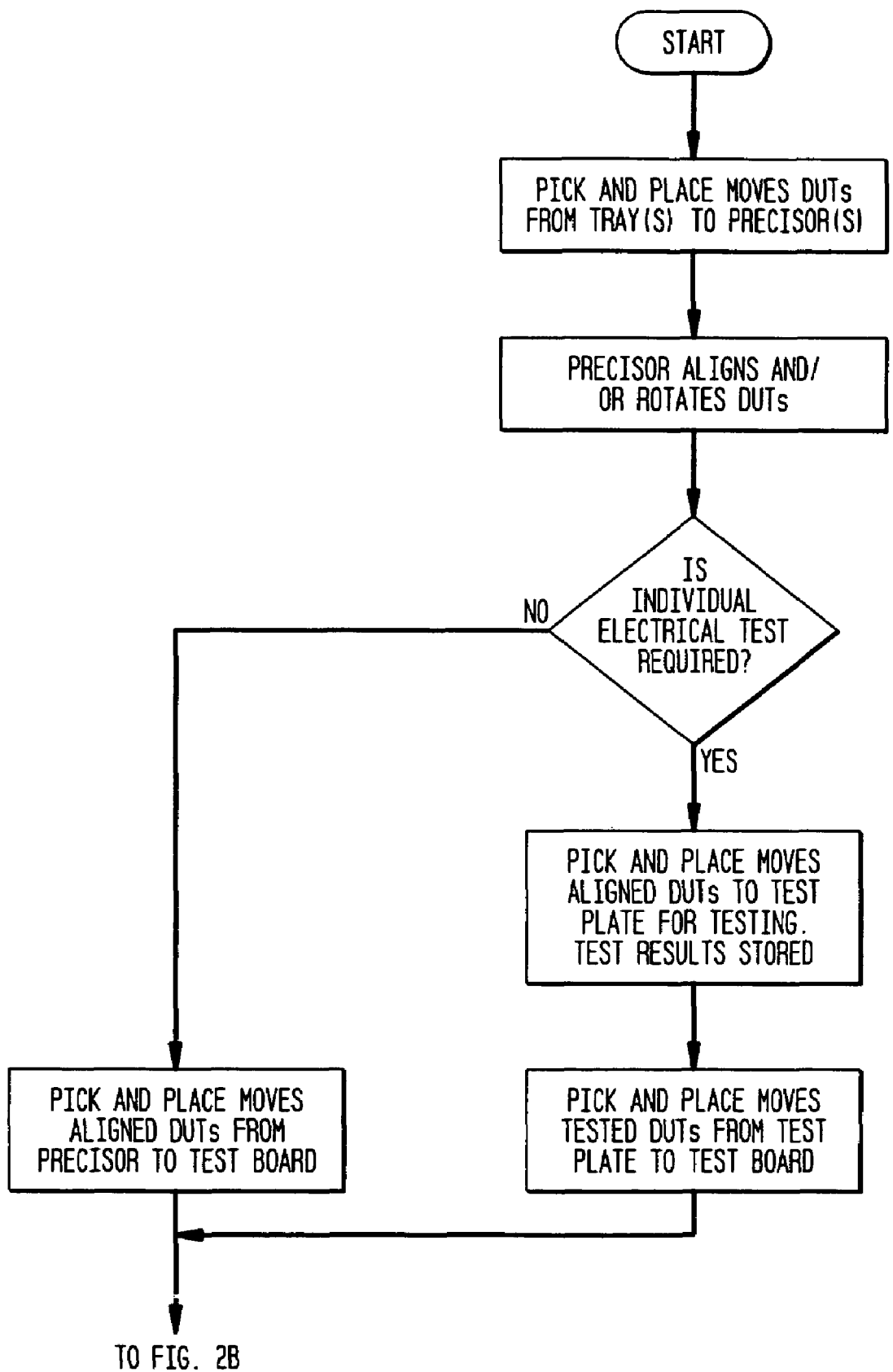

An embodiment of the process of the present invention is described with reference to the process flow diagrams in FIG. 2A–2C. Referring to FIG. 2A, the process starts by causing the pick-and place apparatus to pick DUTs from the carrier tray in which the DUT is supplied (e.g. JDEC trays) and place the DUT in an alignment stage referred to as a precisor plate. In the precisor plate, the DUT is rotated (if its orientation is not suited to proper placement in a test socket) and aligned. After alignment the pick-and-place apparatus' next step depends upon an instruction on the mode of test. If the test mode is one that requires the DUT to be subjected to an individual electrical test, the pick-and-place apparatus removes the DUT from the precisor and places it into a test plate for the individual electrical test that requires isolated electrical circuitry. After the individual test is performed, the pick-and-place mechanism takes the DUT from the test plate and inserts it into a socket in the test board.

If the apparatus is operated in a mode that does not require the DUT to be subjected to an individual electrical test, then the pick-and-place mechanism takes the DUT from the precisor and inserts it directly into the test board.

Referring to FIG. 2B, the pick-and-place mechanism loads the test board intelligently. That is, the apparatus has a memory that stores certain information about the sockets. In this embodiment, the memory stores information about whether or not the socket has previously tested bad, in which case a DUT is not populated into the socket. The memory also stores information about whether or not a known good DUT (i.e. a DUT that tested good when subjected to an individual electrical test) tested bad when subjected to an electrical test in the socket. If the response to either query is yes, then the pick-and-place mechanism does not populate that socket with a DUT. If the response to both queries is no, the socket is populated with a DUT.

Next, a query is run on whether there are any more DUTs to load into the sockets and whether or not there are any more good sockets on the test board to populate. If the response to both queries is yes, the pick-and-place mechanism loads another DUT into the next available socket, repeating the sequence for intelligently loading the sockets that is described above. If the response to either query is no, then another query is run to identify any DUTs that are in the test board but failed the individual electrical test (if performed). If such DUTs are identified, the pick-and-place mechanism is instructed to remove them. If the response to the query is no, then, if all known good sockets on the test board are filled, the test board is moved to the parallel test position. If there are more good sockets to fill, then the loading cycle is repeated for the remaining good sockets.

Referring to FIG. 2C, depending upon the mode of operation, the loaded circuit board is either transported to the parallel test station or returned to the test board storage cassette. If the test board is transported to the parallel test station, the DUTs are subjected to electrical tests at that parallel test station. If all DUTs pass the electrical test, the loaded test board is returned to the test board storage cassette. If one or more DUTs fail the test, then, depending upon the instructions programmed into the apparatus, the DUTs are either removed or not removed. If the instruction is to not remove the DUTs, then the loaded test board is returned to the test board storage cassette. If the instruction is to remove the failed DUTs, then the test board is returned to the DUT load/unload position in the apparatus. There, the pick-and-place mechanism removes the failed DUTs from the test board. The removed DUTs are placed in a storage receptacle for failed DUTs.

Depending upon the programming of the apparatus, the emptied sockets are either refilled with untested DUTs, in which case the test sequence restarts. If the sockets are not refilled, then the test board is returned to the storage cassette. This flexibility offers many advantages. If only a very few DUTs fail the test, then the logic may dictate that the test board simply be returned to the cassette and sent on for further burn-in tests without refilling and retesting additional DUTs. If, however, more than a few DUTs fail, the logic may dictate that it is worth the extra time to refill those sockets with additional DUTs and restart the test sequence.

When a test board is returned to the cassette, the apparatus is programmed to query whether or not there are empty test boards in the cassette. If the response to that query is yes, then the cassette carousel is rotated to feed another empty test board onto the test board carrier. The test sequence above is then repeated. If all test boards are full, the apparatus has reached the end of its sequence and a signal so indicating is transmitted to an operator or controller. The cassette is then detached, and removed for further processing (typically burn-in test of the DUTs populating the test boards).

Figure 3:
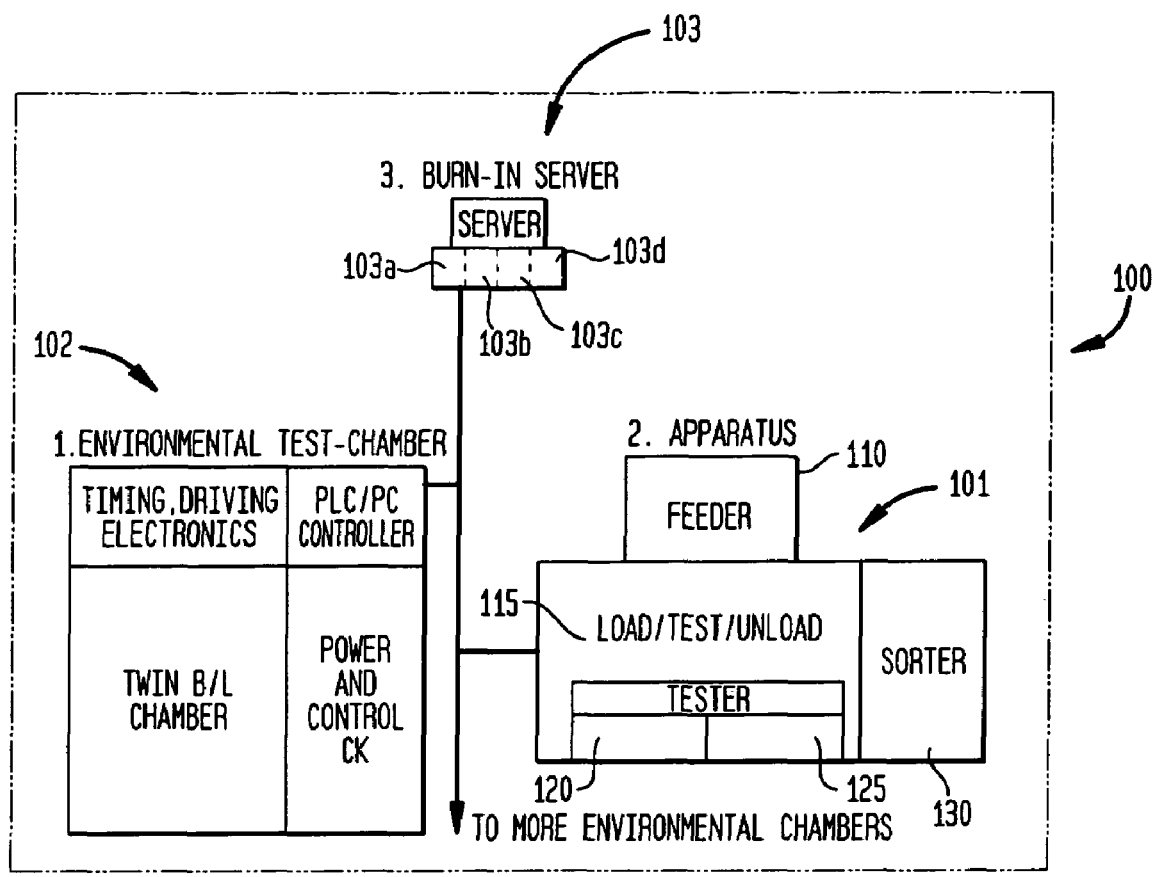
FIG. 3 is a schematic of test apparatus according to one embodiment of the present invention integrated with other environmental testing apparatus.

Referring to FIG. 3, a schematic of a test and burn in system 100, incorporating the test apparatus 101 is illustrated. In addition to the test apparatus 101, the system has an environmental test (e.g. burn-in test chamber) 102 and a controller 103 for automated control of the various functions of the system 101. Controller 103 includes mode controller 103a (also referred to as mode switch herein) and integrated circuit placement selector 103b which is responsive to the mode switch 103a.

This embodiment of the test apparatus has a storage cassette 110 that contains a carousel illustrated schematically as 110a that can be loaded with a plurality of test boards (not shown). The storage cassette 110 cooperates with the DUT load and test chamber 115 of the apparatus to load empty test board to and unload filled test boards from the load and test chamber 115.

The load and test chamber 115 manipulates the DUTs for testing. The load and test chamber employs a pick-and-place mechanism for such purpose. The pick-and-place mechanism is a system of sensors, pneumatic cylinders, servo-motors and stepper motors to unload DUTs input into the chamber 115 from their carriers and move the DUTs between and among the precisor, individual device test station and test boards as required.

The chamber 115 has two electrical test environments, depicted as blocks 120 and 125. Block 120 performs more demanding electrical tests that mandate individual testing of the DUT (due to the need for isolated test circuitry and other requirements previously described). Thus block 120 is the schematic block for the individual device test described above. Block 125 is electrical test circuitry for DUTs when loaded into a test board. This electrical test advantageously mimics the electrical tests performed on the DUTs when in the environmental test chamber 102. By employing the same test hardware, test correlation is more efficient and test discrepancies are reduced, thereby enhancing the accuracy of the test results and ensuring that bad devices are identified without misidentifying good devices as bad. Thus, Block 125 is the schematic block for the loaded board test previously described.

The apparatus 101 is also equipped with a sorter 130. The system server 103, or other control program uses the results of the tests in both the apparatus 101 and the environmental test chamber 102 to physically separate the good DUTs from the bad ones after testing is complete.

Once the test boards are loaded in apparatus 101, the cassette 110 with the loaded test boards is moved to the environmental test chamber 102. An autoguided vehicle (not shown) or manually operated trolley (not shown) can be used for this purpose. Movement of the cassette between apparatus 101 and environmental test chamber 102 is controlled by the burn-in server/controller 103 via block 103c. Server/controller 103 also performs database management functions such as monitoring failure rate, mapping of failures as a function of time, lot, etc. and other information relevant to the burn-in and test process via block 103d.

Figure 4:
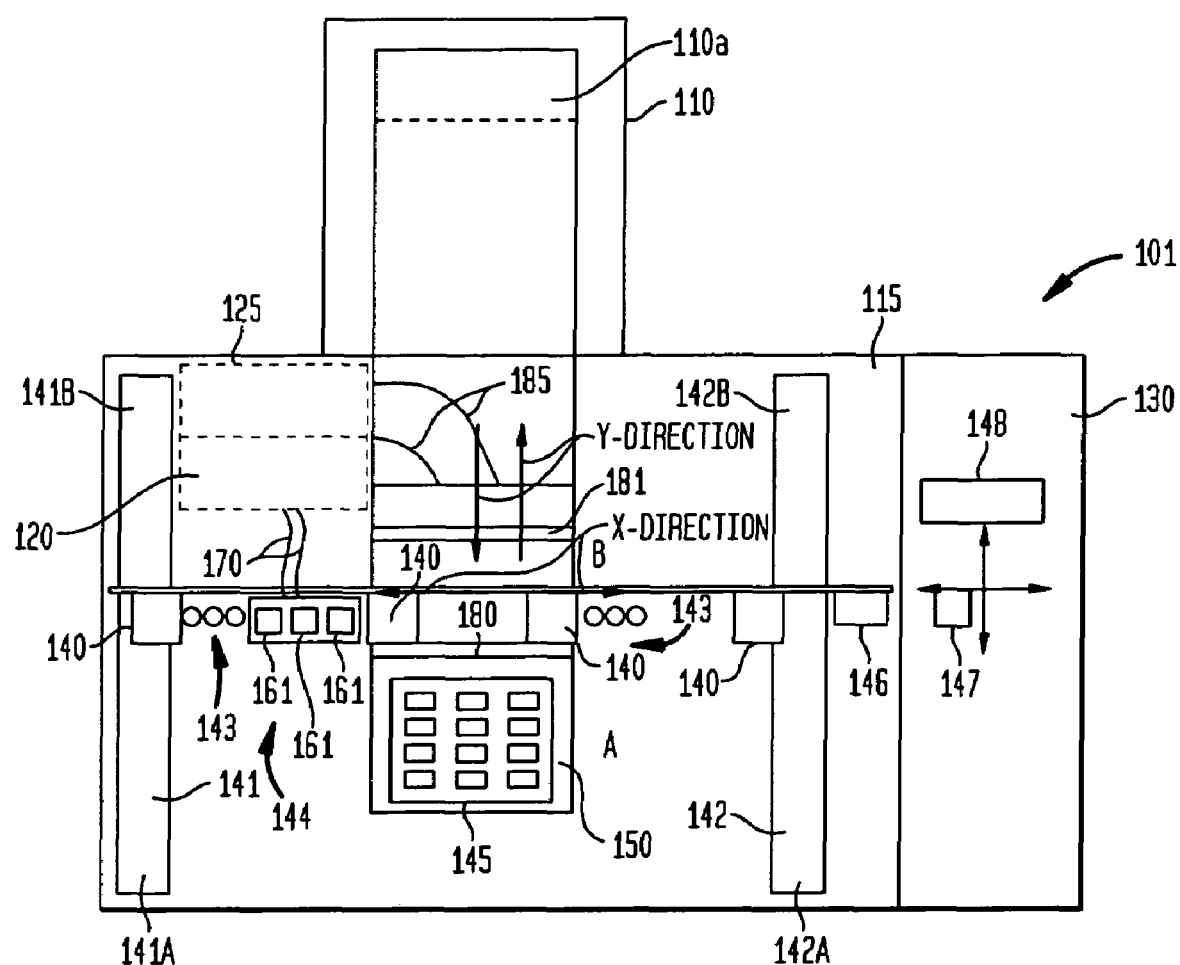
FIG. 4 is a more detailed schematic of the test apparatus depicted in FIG. 3.

FIG. 4 is a more detailed schematic of the apparatus 101 in FIG. 3. The apparatus has a plurality of pick-and-place heads 140. The pick-and-place heads 140 are used to transfer DUTs between and among the DUT carrier input 141, the DUT output tray 142, the precisor 143, the test plate 144, the parallel-test board 145, the sorting plate 146, sorting head 147 and sorting tray 148. The pick-and-place heads 140 are not shown in detail. In one embodiment, the pick-and-place heads 140 have at least three vertically mobile members, each member having a suction device at its moveable end. The suction device is adapted to pick up and retain a DUT. The pick-and-place heads also have a release mechanism (e.g. a mechanism for turning the suction off) for releasing the DUTs.

The pitch (i.e. distance) between the pick-and-place heads is preferably adjustable. This adjustability permits the heads can be adjusted to the pitch of a DUT carrier tray or the pitch of the sockets in a test board.

In one advantageous configuration, the stroke of travel for the mobile members is controlled in two parts. Most of the stroke is controlled by a stepper motor that moves the member close to the DUTs. The remaining portion of the stroke is controlled by air pressure. This enables control of the amount of pressure placed on the DUTs and ensures that excessive force is avoided.

As previously noted, the storage cassette feeds test boards into the test chamber 115. The test boards are fed, one at a time, onto carrier plate 150. Carrier plate 150 conveys the test board 145 to a test board socket loading position A and an in-board test position B. In the exemplary process flow described above, the test board 145 is moved from the cassette 110 and to position A where the sockets are populated with DUTs. After the sockets of test board 145 are loaded, the test board 145 is moved to position B where the sockets/DUTs are subjected to electrical tests.

The input trays 141, 142 are adapted to receive DUT carriers (e.g. JEDEC trays). The input trays are configured to have a receiving end 141A, 142A and an output end 141B, 142B. The DUT carrier (not shown) enters the test chamber 115 at a receiving end, is moved proximate pick-and-place head 140 for unloading. After unloading, it is moved to the output end where empty DUT carriers are stacked. Multiple trays can be used to speed the loading of the test boards.

The pick-and-place heads 140 are used to pick DUTs from the trays, 141, 142 and place them into the precisor plates 143. The precisor plate 143 has cavities that align the devices for placement into either the individual device tester 144 or the sockets in test board 145. The precisor plates 143 also rotate the devices to ensure proper pin alignment. In the depicted embodiment, there are sufficient pick-and-place heads 140 to have dedicated heads for moving the DUTs from the precisor 143 to the test board 145 and for moving DUTs from the precisor 143 to the individual device tester 144.

It is advantageous if the DUT is brought to an appropriate "drop height" by the pick-and-place mechanism and allowed to free fall into a receptacle in the precisor plate 143. The receptacles in the precisor plate 143 are self-adjusting so that the pitch of the precisor receptacles matches the pitch of the pick-and-place mechanism. The pitch of the precisor receptacles also matches the pitch of the sockets in the circuit board.

The precisor 143 has the capacity to rotate the DUTs to match the pin alignment of the sockets in the individual device tester 144 or in the test board 145. The rotation of the precisor 143 is controlled by software. For example, the precisor senses the placement of the test pin (e.g. pin-1) in the device. The software then compares the sensed location with the location of pin-1 in the socket downstream from the precisor (i.e. either the sockets in the DUT tester or the test board). The software, based on this comparison, determines if the DUT can be properly inserted into the socket downstream without rotation, or whether rotation is required. If rotation is required, software determines the degree of rotation (for a square or rectangular DUT the rotation degree options are +/−90 degrees and 180 degrees).

Once alignment in the precisor is complete, the DUT is moved to either the individual device tester 144 or the test board 145, depending upon the particular instruction to the apparatus 101 from the burn-in server 103. In either case, the pick-and-place heads 140 are used to move the DUTs from the precisor 143 to the next test site. If the next site is the individual device tester 144, the DUTs are removed from the precisor plate 143 and positioned by the pick and place heads 140 to a testing height above the individual device tester 144. The pick-and-place heads 140 then press the DUTs into the individual device tester 144.

The individual device tester 144 is depicted in this embodiment as a test plate with three receptacles 161. The receptacles of the tester 144 are connected with circuitry 120 to perform DC and/or parametric tests on the DUTs.

Figure 5:
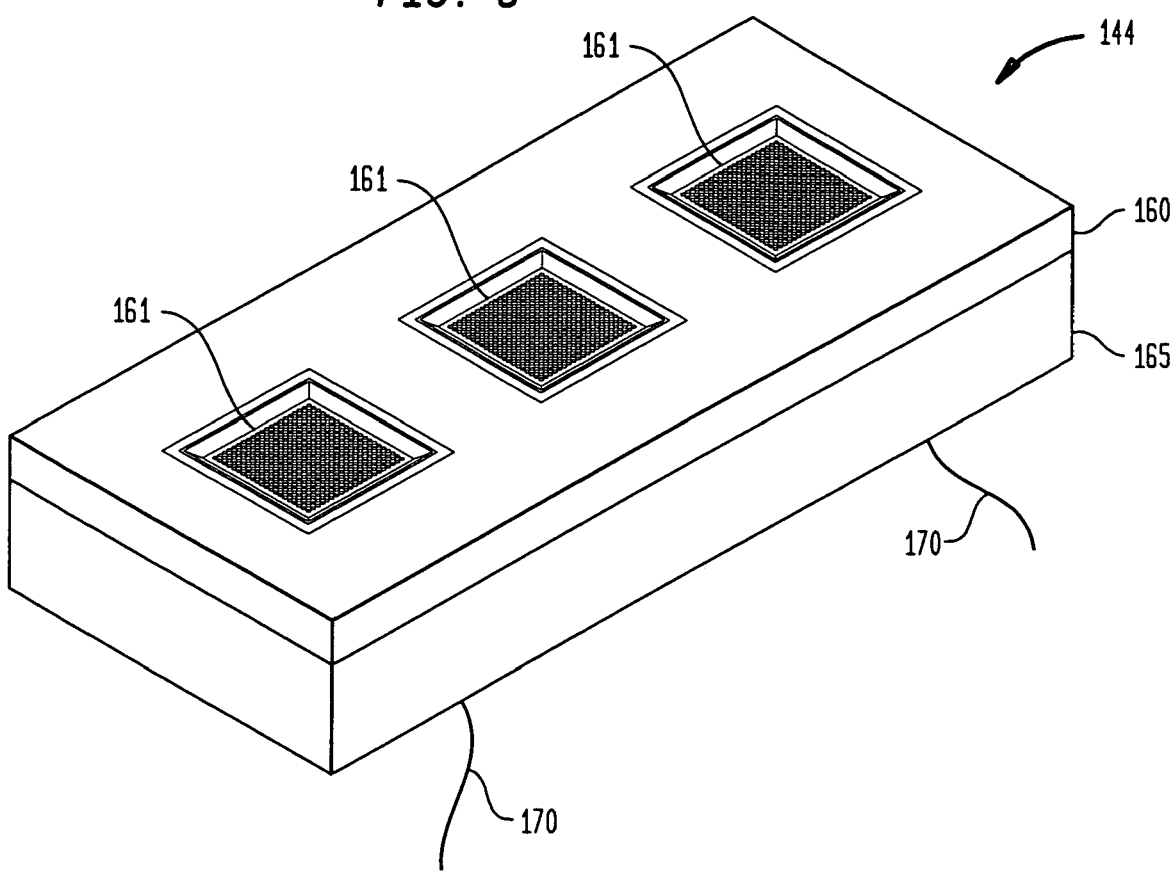
FIG. 5 is perspective view a top view of an integrated circuit test plate.
Figure 6:
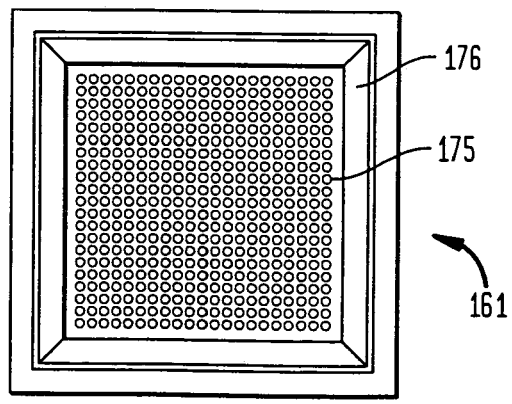
FIG. 6 is a view of a single socket in the integrated circuit test plate of FIG. 5.

With reference to FIG. 5, the tester 144 consists of a top alignment plate 160 with the three receptacles 161 therein. The receptacles are sized to receive the DUT (typically a ball grid array (BGA) or chip scale package (CSP)). It is advantageous if the number of pick-and-place heads 140 (FIG. 4) corresponds to the number of receptacles 161 in the tester 144. The top alignment plate 160 is on and supported by a test pin matrix block 165. The test pin matrix block has a matrix of spring loaded test pins 175 (FIG. 6). The pick-and-place mechanism 140 presses DUTs into the receptacles with sufficient force to switch on the electrical test. The control program then causes the specified electrical test to be performed. The test pins are electrically connected to the test circuitry 120 via cables 170. The spring loaded test pins 175 ensure that the DUTs are properly seated for carrying out the electrical test performed by test circuitry 120.

FIG. 6 is a top view of a receptacle 161. The matrix of pins 175 is readily observed. The receptacle 161 is readily adapted to the size and configuration of a particular DUT. This is accomplished by changing the size of the opening 176. For convenience this can be done by simply removing the alignment plate 160 and replacing it with a different alignment plate 160 with openings 161 of the appropriate size.

Once the individual DUT test is completed, the DUT is placed in the test board 145 as previously described. If a DUT fails a test, it can be migrated out of the test board 145 and into the tray 148 configured to receive failed devices. The apparatus illustrated in FIG. 4 is configured to accomplish this migration using pick-and-place head 140 to take the DUT from the test board 145 and place the DUT in precisor 143 to the right of the test board 145. Another pick-and-place head 140 is then used to move the device first into sort plate 146. Sort place 146 is a temporary holding stage for the failed DUT to await pick up by pick-and-place sort head 147. Sort head 147 is then used to move the failed DUT from sort plate 146 to failed DUT tray 148.

Thus, when operated in a first mode in which DUTs are subjected to individual test 120, DUTs are loaded into chamber 115 via tray 141. The pick-and-place heads 140 are used to migrate the DUT from tray 141 to precisor 143 proximate to tray 141. From there pick-and-place head 140 moves the DUT to the individual device tester 144, where the above described electrical tests 120 are performed. The DUTs are then transferred from the tester 144 to the test board 145. For this transfer, press bar 180 is used to hold open the sockets in test board 145. A second press bar 181 is also provided to ensure that the next row of sockets is opened when the row preceding it has been filled with DUTs. The action of pressbars 180,181 is controlled by software to avoid delays in the loading of the test board 145 by the pick-and-place heads 140.

As previously noted, DUTs that fail the individual device test 120 are "migrated out" of the test board 145 using the pick-and-place heads 140 and precisor 143 to the right of the test board 145. From the precisor, these failed devices are moved to sort plate 146 for temporary storage. Pick-and-place sorter head 147 then moves these failed DUTs from the sort plate 146 to the failed DUT tray 148.

In an optional embodiment, the apparatus can also be operated in a sort mode. In sort mode, the sorter 130 of the apparatus figures prominently. In this embodiment, a fully populated test board is placed in position A. In this illustrative embodiment, the fully loaded test board has been returned to the apparatus 101 after environmental testing in the environmental test chamber 102. Server 103 has retained the results of the environmental test, including which DUTs have passed or failed the environmental test (and their location in the test board). The loaded test board is conveyed to the apparatus 101 using the previously described mechanisms for conveying the loaded test boards from the apparatus 101 to the environmental test chamber 102. The loaded test boards are then conveyed to position A in the test chamber 115 using the mechanisms previously described.

The server 103 then instructs the pick and place apparatus 140 on how to depopulate the test board 145. The placement of the DUTs from the test board 145 will depend on whether the particular DUT passed or failed a previous test. If the DUT passed, it will be unloaded into a carrier tray (not shown) positioned on tray 142. If the DUT failed a prior test, then the DUT will be placed on sort plate 146 and held there until sort head 147 can move the DUT from sort plate 146 into failed DUT tray 148.

In yet another embodiment, when the apparatus is operated in the mode in which a DUT is not subjected to an individual test, the burn-in server 103 causes DUTs to be introduced into chamber 115 via trays 141 and 142. This expedites loading the test board 145, because DUTs are introduced into the test board from both the left and the right.

After the test board sockets are populated with DUTs, the test board is moved from position A to position B. In position B, an electrical connection 185 is used to electrically connect the DUTs in the test board to the parallel test circuitry 125. As previously noted, if one or more devices fail this test, the test board 145 can be moved back to position A, the failed DUT removed and replaced by another DUT in the manner described above.

As previously noted, the apparatus, in the preferred form of the present invention, provides many advantages, chief of which is flexibility for the user. Such an apparatus permits the user to choose between conducting a more time-intensive individual DUT test and a less time-intensive test of DUTs populated into test boards 145. The more time-intensive electrical tests are typically performed on new device types or prototypes, where a higher failure rate is expected. With these types of devices, there is a greater probability of hard failure. Hard failures, with serious faults can disrupt signal lines and stop the execution of such tests. This causes delays in operation. The apparatus is equipped with a mode switch 103*a* that allows selection between a mode that requires an individual electrical test and one that does not.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An automated test handler system for integrated circuit devices comprising:
   a housing, said housing configured to provide a controlled testing environment;
   a pick-and-place apparatus disposed within said housing;
   a loader comprising a conveyer in communication with an interior portion of said housing, said conveyer configured to introduce test boards into said interior portion of said housing, said test boards having a plurality of sockets, individual ones of said plurality of sockets adapted to receive an integrated circuit device;

an input mechanism disposed within said housing and adapted to receive integrated circuit devices to be tested;

an integrated circuit test plate proximate to said input mechanism, the integrated circuit test plate configured with test sockets adapted to receive an integrated circuit device and to electrically connect said integrated circuit device with test electronics;

a test board carrier proximate to said test plate said test board carrier configured to receive said test board from said loader and transport said test board to at least a first loading position within said housing where said test board is populated with said integrated circuit device and a second parallel testing position where one of either said socket, the integrated circuit device in said socket or both said socket and said integrated circuit device are subject to electrical test;

said pick-and-place apparatus configured to transfer said integrated circuit device between and among said input mechanism, said integrated circuit test plate and said test board when said carrier is in said first position; and a parallel test station that is adapted to cooperate with said test board to provide electrical connection between said sockets in said test board and electrical test circuitry and electrical connection between said integrated circuit device in said test board to electrical test circuitry when said test board is in said second position.

2. The test handler system of claim 1 further comprising a precisor plate disposed in said housing and proximate to said input mechanism, said precisor plate having an alignment cavity.

3. The test handler system of claim 2 wherein said pick-and-place apparatus is further configured to place said integrated circuit device into and remove said integrated circuit device from said precisor plate.

4. The test handler system of claim 1 further comprising a controller, said controller configured to receive test information from said parallel test station, store said information from said parallel test station, said test information being associated with said socket in said test board for which said test information was received; query the stored information; and communicate a socket population instruction to said pick-and-place mechanism, said instruction based on said test information associated with said socket.

5. The test handler system of claim 4 wherein said test information from said parallel test station comprises electrical test information for said integrated circuit in said socket, wherein the controller associates said electrical test information with said socket in said test board in which said integrated circuit device is placed.

6. The test handler system of claim 1 wherein the integrated circuit test plate further comprises an alignment cavity and a test-pin matrix block.

7. The test handler system of claim 6 wherein said alignment cavity is in detachable engagement with said test-pin matrix box.

8. The test handler system of claim 7 wherein said loader further comprises a storage cassette having a plurality of test board compartments, a carousel for said plurality of test board compartments that moves said test board compartments through a series of positions, one of which is an unload position.

9. The test handler system of claim 8 wherein said loader is in detachable engagement with said housing.

10. The test handler system of claim 1 further comprising a sorter module adapted to receive integrated circuit devices that fail the electrical tests performed thereon at one of said integrated circuit test plate, said parallel test station or both.

11. The test handler system of claim 1 further comprising a mode controller, wherein said mode controller switches said test handler system between at least two testing modes, a first testing mode and a second testing mode.

12. The test handler system of claim 11 wherein said mode controller further comprises an integrated circuit placement selector for said pick-and-place mechanism that is responsive to said mode controller.

13. The test handler system of claim 12 wherein said first testing mode requires said integrated circuit to be subjected to an individual electrical test and, when said test handler system is in said first testing mode, said integrated circuit placement selector instructs said pick-and-place mechanism to place integrated circuit devices in said integrated circuit test plate for an electrical test prior to inserting the integrated circuit device into a socket in said test board.

14. The test handler system of claim 13 wherein said second testing mode requires said integrated circuit to bypass an individual electrical test and, when said test handler system is in said second testing mode, said integrated placement selector instructs said pick-and-place mechanism to bypass said test plate and place integrated circuit devices directly from said precisor to a socket in said test board.

15. The test handler system of claim 11 further comprising an integrated circuit unloader/loader tray that is proximate to said test board carrier and wherein said pick-and-place apparatus is configured to place integrated circuits therein for removal from said test handler system when said device is operated in said first mode and said pick-and-place apparatus is configured to remove said integrated circuit devices from said unloader/loader tray for testing in said test handler system when said test handler system is operated in said second mode.

16. The test handler system of claim 1 further comprising a sorter.

17. The test handler system of claim 16 wherein the sorter further comprises a sort controller, said controller associating said integrated circuits with a pass or fail designation, said pick-and-place apparatus configured to place an integrated circuit device with a pass designation n a first location and an integrated circuit device associated with a fail designation in a second location based on an instruction from said sort controller.

18. A test handler system for use with integrated circuit devices and with a plurality of test boards, each test board having a plurality of sockets, the individual ones of said plurality of sockets adapted to receive individual integrated circuit devices said test handler system comprising:

a parallel tester operative to test at least one of the group consisting of (i) the sockets of a test board received in said parallel test device, (ii) integrated circuit devices populating sockets in said test device and (iii) both the sockets and the integrated circuit devices populating said sockets;

a test board handler adapted to provide a series of test boards at said parallel tester;

an input mechanism for providing a plurality of integrated circuit devices to be tested;

an integrated circuit test plate for electrically testing individual integrated circuit devices, the integrated circuit test plate having at least one test socket adapted to receive an integrated circuit device and to electrically connect the integrated circuit device with test electronics;

a pick-and-place apparatus configured to transfer integrated circuit devices from said input mechanism to i) said integrated circuit test plate and then from said integrated circuit test plate to sockets in a test board or (ii) sockets in a test board without engaging the integrated circuit device in a test socket of said integrated circuit test plate.

19. The system of claim 18 further comprising a loading station, wherein said board handler is operative to position each test board at said loading station before presenting such board to the board tester, said pick-and-place apparatus being operative to transfer integrated circuits to sockets in a test board while the test board is at said loading station.

20. An integrated circuit test plate for performing electrical tests on an integrated circuit device comprising:

test sockets adapted to receive an integrated circuit device and to electrically connect said integrated circuit device with test electronics the test sockets comprising an alignment cavity and a test-pin matrix block wherein said alignment cavity is adapted to align a first integrated circuit device and is in detachable engagement with said test-pin matrix box, and said alignment cavity is replaceable by a second alignment cavity, wherein said second alignment cavity is adapted to align a second integrated circuit device, said second integrated circuit device having a configuration that is different from the first integrated circuit device, the test-pin matrix box being adapted to test at least said first integrated circuit device or said second integrated circuit device.

* * * * *